US010512175B2

(12) United States Patent
Kwon et al.

(10) Patent No.: US 10,512,175 B2
(45) Date of Patent: Dec. 17, 2019

(54) METHOD FOR MANUFACTURING FLEXIBLE PRINTED CIRCUIT BOARD AND FLEXIBLE PRINTED CIRCUIT BOARD MANUFACTURED THEREBY

(71) Applicant: AMOGREENTECH CO., LTD., Gimpo-si, Gyeonggi-do (KR)

(72) Inventors: O-Chung Kwon, Chungcheongbuk-do (KR); Jeong-Sang Yu, Gyeonggi-do (KR); Jae-Sic Kim, Chungcheongnam-do (KR); Yong-Il Kim, Chungcheongnam-do (KR); Hyun-Soo Jang, Incheon (KR)

(73) Assignee: AMOGREENTECH CO., LTD. (KR)

( * ) Notice: Subject to any disclaimer, the term of this patent is extended or adjusted under 35 U.S.C. 154(b) by 889 days.

(21) Appl. No.: 14/897,200

(22) PCT Filed: Apr. 11, 2014

(86) PCT No.: PCT/KR2014/003151
§ 371 (c)(1),
(2) Date: Feb. 5, 2016

(87) PCT Pub. No.: WO2014/168451
PCT Pub. Date: Oct. 16, 2014

(65) Prior Publication Data
US 2016/0165721 A1 Jun. 9, 2016

(30) Foreign Application Priority Data

Apr. 12, 2013 (KR) .................. 10-2013-0040465
Apr. 12, 2013 (KR) .................. 10-2013-0040466
Apr. 10, 2014 (KR) .................. 10-2014-0043073

(51) Int. Cl.
H05K 3/46 (2006.01)
H05K 3/42 (2006.01)
(Continued)

(52) U.S. Cl.
CPC ......... *H05K 3/4664* (2013.01); *H05K 3/1208* (2013.01); *H05K 3/28* (2013.01)

(58) Field of Classification Search
CPC ........ H05K 3/007; H05K 3/4038; H05K 3/42; H05K 3/0011; H05K 3/4664;
(Continued)

(56) References Cited

U.S. PATENT DOCUMENTS 4,705,719 A * 11/1987 Yamanaka .............. B32B 27/20
428/323
5,396,034 A * 3/1995 Fujita .................. H01L 21/4857
174/255
(Continued)

FOREIGN PATENT DOCUMENTS

CN 101801156 A 8/2010
JP 0735106 A 5/1990
(Continued)

OTHER PUBLICATIONS

International Preliminary Report on Patentability for International Application No. PCT/KR2014/003151 dated Oct. 13, 2015, 8 pages.
(Continued)

*Primary Examiner* — Peter Dungba Vo
*Assistant Examiner* — Kaying Kue
(74) *Attorney, Agent, or Firm* — TraskBritt

(57) ABSTRACT

A method for manufacturing a flexible printed circuit board includes preliminarily thermally deforming s substrate through heating, forming a circuit pattern with a conductive paste on the preliminarily thermally deformed substrate, and firing the circuit pattern. A flexible printed circuit board includes a substrate, and a circuit pattern formed by firing a conductive paste on a first surface of the substrate. The substrate is preliminarily thermally deformed and, thus, a shrinkage variation thereof before and after firing the con-
(Continued)

ductive paste is zero. Dimensional stability when firing the circuit pattern printed with the conductive paste can be ensured, deterioration of adhesion between the circuit pattern and the substrate attributable to film deformation upon firing can be prevented, and stable adhesion of the circuit pattern can be maintained even after firing.

16 Claims, 10 Drawing Sheets

(51) Int. Cl.
*H05K 3/12* (2006.01)
*H05K 3/28* (2006.01)

(58) Field of Classification Search
CPC .. H05K 3/1208; H05K 3/28; Y10T 29/49165; Y10T 29/49124; Y10T 29/49155; Y10T 29/49156; Y10T 29/49167
USPC .............. 29/852, 846, 829; 174/261, 250
See application file for complete search history.

(56) References Cited

U.S. PATENT DOCUMENTS

| | | | | |
|---|---|---|---|---|
| 9,949,379 | B2* | 4/2018 | Kim | H05K 3/361 |
| 2002/0063664 | A1* | 5/2002 | Shinoda | G09G 3/22 |
| | | | | 345/60 |
| 2003/0138733 | A1* | 7/2003 | Sachdev | C08F 290/048 |
| | | | | 430/311 |
| 2005/0196707 | A1* | 9/2005 | Cok | G03F 7/0007 |
| | | | | 430/318 |
| 2006/0048963 | A1* | 3/2006 | Nishinaka | B32B 7/12 |
| | | | | 174/393 |
| 2006/0193970 | A1* | 8/2006 | Myung | C23C 26/00 |
| | | | | 427/96.1 |
| 2010/0065963 | A1* | 3/2010 | Eldridge | B23K 20/004 |
| | | | | 257/734 |
| 2010/0084168 | A1 | 4/2010 | Chou | |
| 2010/0113689 | A1* | 5/2010 | Naiki | C08G 18/3234 |
| | | | | 524/606 |
| 2010/0116525 | A1* | 5/2010 | Oka | H05K 1/118 |
| | | | | 174/254 |
| 2011/0043954 | A1* | 2/2011 | Chuang | H01T 4/08 |
| | | | | 361/56 |
| 2011/0102054 | A1* | 5/2011 | Domes | H01L 24/49 |
| | | | | 327/419 |
| 2013/0057999 | A1* | 3/2013 | Boday | G11B 5/6094 |
| | | | | 361/220 |
| 2015/0016083 | A1* | 1/2015 | Nootens | H01C 17/00 |
| | | | | 361/820 |
| 2015/0225523 | A1* | 8/2015 | Suenaga | C08G 73/1039 |
| | | | | 428/435 |
| 2016/0135285 | A1* | 5/2016 | Kim | H05K 3/361 |
| | | | | 174/251 |

FOREIGN PATENT DOCUMENTS

| | | |
|---|---|---|
| JP | 2708598 A | 10/1991 |
| JP | 2010093224 A | 4/2010 |
| KR | 1020010077345 A | 8/2001 |
| KR | 1020030067943 | 8/2003 |
| KR | 1020050017905 A | 2/2005 |
| KR | 1020050082450 A | 8/2005 |
| KR | 20090106777 A | 10/2009 |
| KR | 1020110052759 A | 5/2011 |
| KR | 1020120016297 A | 10/2012 |
| KR | 20120137175 A | 12/2012 |

OTHER PUBLICATIONS

International Search Report for International Application No. PCT/KR2014/003151 dated Jul. 18, 2014, 2 pages.
International Written Opinion for International Application No. PCT/FR2014/003151 dated Jul. 18, 2014, 10 pages.
Chinese First Office Action for Chinese Application No. 201480032626.9 dated Aug. 2, 2017, 10 pages.
Chinese First Search for Chinese Application No. 2014800326269 dated Jul. 25, 2017, 1 page.
Korean Office Action for Korean Application No. 10-2014-0043073 dated Jan. 20, 2015, 24 pages.
Korean Office Action for Korean Application No. 10-2014-0043073 dated Jul. 7, 2015, 3 pages.
Korean Office Action for Korean Application No. 10-2014-0043073 dated Oct. 16, 2015, 3 pages.
Chinese Second Office Action for Chinese Application No. 201480032626.9, dated May 14, 2018, 20 pages.

* cited by examiner

METHOD FOR MANUFACTURING FLEXIBLE PRINTED CIRCUIT BOARD AND FLEXIBLE PRINTED CIRCUIT BOARD MANUFACTURED THEREBY

CROSS-REFERENCE TO RELATED APPLICATIONS

This application is a national phase entry under 35 U.S.C. § 371 of International Patent Application PCT/KR2014/003151, filed Apr. 11, 2014, designating the United States of America and published in English as International Patent Publication WO 2014/168451 A1 on Oct. 16, 2014, which claims the benefit under Article 8 of the Patent Cooperation Treaty and under 35 U.S.C. § 119(e) to Korean Patent Application Serial No. 10-2014-0043073, filed Apr. 10, 2014, Korean Patent Application Serial No. 10-2013-0040466, filed Apr. 12, 2013, and to Korean Patent Application Serial No. 10-2013-0040465, filed Apr. 12, 2013.

TECHNICAL FIELD

This disclosure relates to a method for manufacturing a flexible printed circuit board and a flexible printed circuit board manufactured thereby and, more particularly, to a flexible printed circuit board and a method for manufacturing the same, in which a circuit pattern is formed through low-temperature firing after printing with a conductive paste.

BACKGROUND

Typically, flexible printed circuit boards, which are configured such that a circuit pattern is formed on a thin insulating film, find applications in many fields including those of mobile electronic instruments, as well as automatic instruments and displays that must be flexible for their operation.

Particularly, there has been a strong demand for flexible printed circuit boards for mobile terminals such as smartphones. For example, flexible printed circuit boards are mainly utilized in NFC (Near Field Communication) antennas or digitizers of mobile terminals.

When installed in a display panel of an electronic instrument, such as a cellular phone, PDA, laptop computer, etc., a digitizer functions to recognize and represent the coordinates of touch points on the display panel, allowing for the natural representation of written letters or notes on the display panel.

Accordingly, the size of digitizers corresponds to that of display panels. With the tendency of display panels toward enlargement, such as in smartphones, tablet PCs, outdoor advertising displays, etc., digitizers have gradually increased in size.

Typically, a flexible printed circuit board is manufactured by etching copper foil that has been laminated on a flexible substrate or by printing a circuit pattern with a conductive paste or conductive ink on a flexible insulating film and then plating the circuit pattern.

However, such flexible printed circuit boards have to undergo etching or plating, and thus suffer from complicated manufacturing processes and high manufacturing costs.

BRIEF SUMMARY

Technical Problem

Accordingly, this disclosure has been made, keeping in mind the above problems encountered in the related art. An object of the disclosure is to provide a method for manufacturing a flexible printed circuit board and a flexible printed circuit board manufactured thereby, in which a substrate is subjected to preliminary thermal treatment to thus ensure dimensional stability and improve operational stability.

Another object of this disclosure is to provide a method for manufacturing a flexible printed circuit board and a flexible printed circuit board manufactured thereby, in which a via hole may be sufficiently filled so that a pattern on the first surface of the substrate is electrically connected to a pattern on the second surface thereof, and also in which adhesion between the substrate and the conductive paste may be enhanced, thus solving problems related to stripping of the pattern.

Technical Solution

In order to accomplish the above objects, this disclosure provides a method for manufacturing a flexible printed circuit board, comprising: preliminarily thermally deforming a substrate through heating; forming a circuit pattern with a conductive paste on the preliminarily thermally deformed substrate; and firing the circuit pattern.

In the disclosure, the substrate may be a polyimide (PI) film or a PET film.

In this disclosure, the conductive paste may be a silver paste comprising a silver powder, a polymer resin, and a solvent.

In the disclosure, firing the circuit pattern may be performed at 200 to 450° C.

In this disclosure, preliminarily thermally deforming may be performed by heating the substrate to a temperature higher than or equal to a temperature at which the circuit pattern is fired.

The method for manufacturing the flexible printed circuit board according to an embodiment of the disclosure may further comprise baking the preliminarily thermally deformed substrate through heating to remove water therefrom after preliminarily thermally deforming and before forming the circuit pattern with the conductive paste.

The method for manufacturing the flexible printed circuit board according to an embodiment of this disclosure may further comprise forming a protective coating layer for protecting the circuit pattern by applying a coating solution on a first surface of the substrate after firing the circuit pattern.

In the disclosure, forming the protective coating layer may be performed by applying the coating solution on the first surface of the substrate to form a protective coating layer and drying the protective coating layer.

In this disclosure, the protective coating layer may be formed to a thickness of at least 9 μM on the circuit pattern.

In the disclosure, forming the protective coating layer may be performed by applying the coating solution on the first surface of the substrate through screen printing, in which a thickness of the coating solution is adjusted by varying a mesh size of a screen.

The method for manufacturing the flexible printed circuit board according to an embodiment of this disclosure may further comprise forming an additional circuit pattern with a conductive paste on the protective coating layer; and firing the additional circuit pattern.

The method for manufacturing the flexible printed circuit board according to an embodiment of the disclosure may further comprise forming a via hole in the preliminarily thermally deformed substrate; and filling the via hole with a conductive paste.

The method for manufacturing the flexible printed circuit board according to an embodiment of this disclosure may further comprise laminating a carrier on a second surface of the substrate between forming the via hole and filling the via hole.

The method for manufacturing the flexible printed circuit board according to an embodiment of the disclosure may further comprise performing corona treatment for modifying a surface of the substrate before forming the circuit pattern with the conductive paste.

In this disclosure, forming the circuit pattern may comprise forming a first circuit pattern with a conductive paste on a first surface of the substrate; and forming a second circuit pattern with a conductive paste on the second surface of the substrate.

The method for manufacturing the flexible printed circuit board according to an embodiment of the disclosure may further comprise removing the carrier from the second surface of the substrate after forming the first circuit pattern on the first surface of the substrate; laminating the carrier on the first surface of the substrate before forming the second circuit pattern; and removing the carrier from the first surface of the substrate after forming the second circuit pattern.

In this disclosure, the first circuit pattern may be an X-axis coordinate recognition pattern part including a plurality of X-axis electrodes spaced apart from each other, and the second circuit pattern may be a Y-axis coordinate recognition pattern part including a plurality of Y-axis electrodes spaced apart from each other.

In the disclosure, the carrier may be a writing paper.

The method for manufacturing the flexible printed circuit board according to an embodiment of this disclosure may further comprise forming a protective coating layer for protecting the circuit pattern by applying a coating solution on the first surface of the substrate after firing the circuit pattern, wherein forming the protective coating layer may comprise: applying a coating solution on the first surface of the substrate, thus forming a first protective coating layer on the first surface of the substrate; and applying a coating solution on the second surface of the substrate, thus forming a second protective coating layer on the second surface of the substrate.

The method for manufacturing the flexible printed circuit board according to an embodiment of the disclosure may further comprise curing the first protective coating layer and the second protective coating layer through heating.

In this disclosure, curing the first protective coating layer and the second protective coating layer may be performed at 200 to 450° C.

The method for manufacturing the flexible printed circuit board according to an embodiment of the disclosure may further comprise performing corona treatment for modifying a surface of the substrate before forming the circuit pattern with the conductive paste, wherein performing the corona treatment may comprise: subjecting the first surface of the substrate to corona treatment before forming the first circuit pattern; and subjecting the second surface of the substrate to corona treatment before forming the second circuit pattern.

In addition, a flexible printed circuit board according to an embodiment of this disclosure comprises a substrate; and a circuit pattern formed by firing a conductive paste on the substrate, wherein the substrate is preliminarily thermally deformed and thus a shrinkage variation thereof before and after firing the conductive paste is zero.

The flexible printed circuit board according to an embodiment of the disclosure may further comprise a protective coating layer for protecting the circuit pattern formed on the substrate.

In this disclosure, the substrate may be a PI film or a PET film, and the protective coating layer may be formed of a PI solution or a PAI solution.

The flexible printed circuit board according to an embodiment of the disclosure may further comprise additional circuit pattern layers sequentially formed on the protective coating layer, wherein the protective coating layer is disposed between the additional circuit pattern layers, and the additional circuit pattern layers are interconnected through a via formed in the protective coating layer.

In this disclosure, the circuit pattern may comprise a first circuit pattern formed on the first surface of the substrate and a second circuit pattern formed on the second surface of the substrate.

The flexible printed circuit board according to an embodiment of the disclosure may further comprise a first protective coating layer formed on the first surface of the substrate and a second protective coating layer formed on the second surface of the substrate.

In this disclosure, the first circuit pattern may be an X-axis coordinate recognition pattern part including a plurality of X-axis electrodes spaced apart from each other, and the second circuit pattern may be a Y-axis coordinate recognition pattern part including a plurality of Y-axis electrodes spaced apart from each other.

Advantageous Effects

According to this disclosure, preliminary thermal treatment of a substrate can ensure dimensional stability when firing a circuit pattern printed with a conductive paste, and can also prevent adhesion between the circuit pattern and the substrate from deteriorating, which can occur due to the deformation of the film upon firing. Furthermore, stable adhesion of the circuit pattern can be maintained even after firing.

According to this disclosure, a via hole can be filled with sufficient conductive paste, thereby improving the operational reliability of the circuit pattern formed on both surfaces of the substrate.

According to the disclosure, the circuit pattern is protected by a coating layer, thereby preventing the circuit pattern from damage due to warping or bending during the use thereof and maintaining the circuit pattern firmly attached to the substrate.

DETAILED DESCRIPTION

Figure 1:
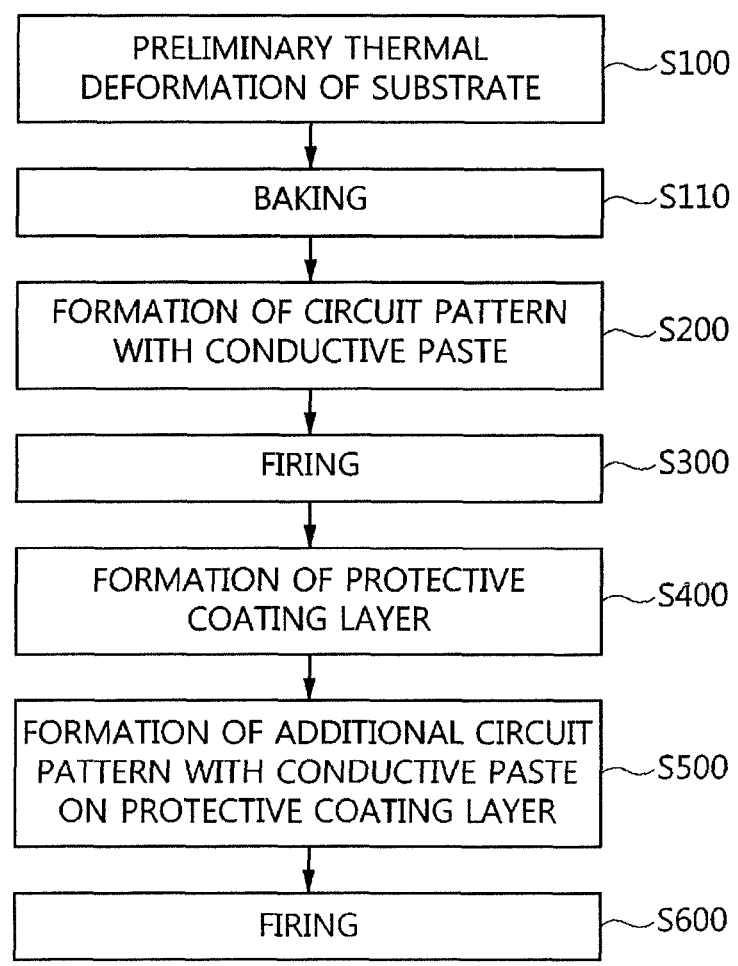
FIG. 1 is a flowchart illustrating the process of manufacturing a flexible printed circuit board according to an embodiment of this disclosure.

This disclosure will be described in detail below with reference to the accompanying drawings. In the following description, redundant descriptions and detailed descriptions of known functions and elements that may unnecessarily make the gist of the disclosure obscure will be omitted. Embodiments of this disclosure are provided to fully describe this disclosure to those having ordinary knowledge in the art to which the disclosure pertains. Accordingly, in the drawings, the shapes and sizes of elements may be exaggerated for the sake of clearer description.

Figure 2:
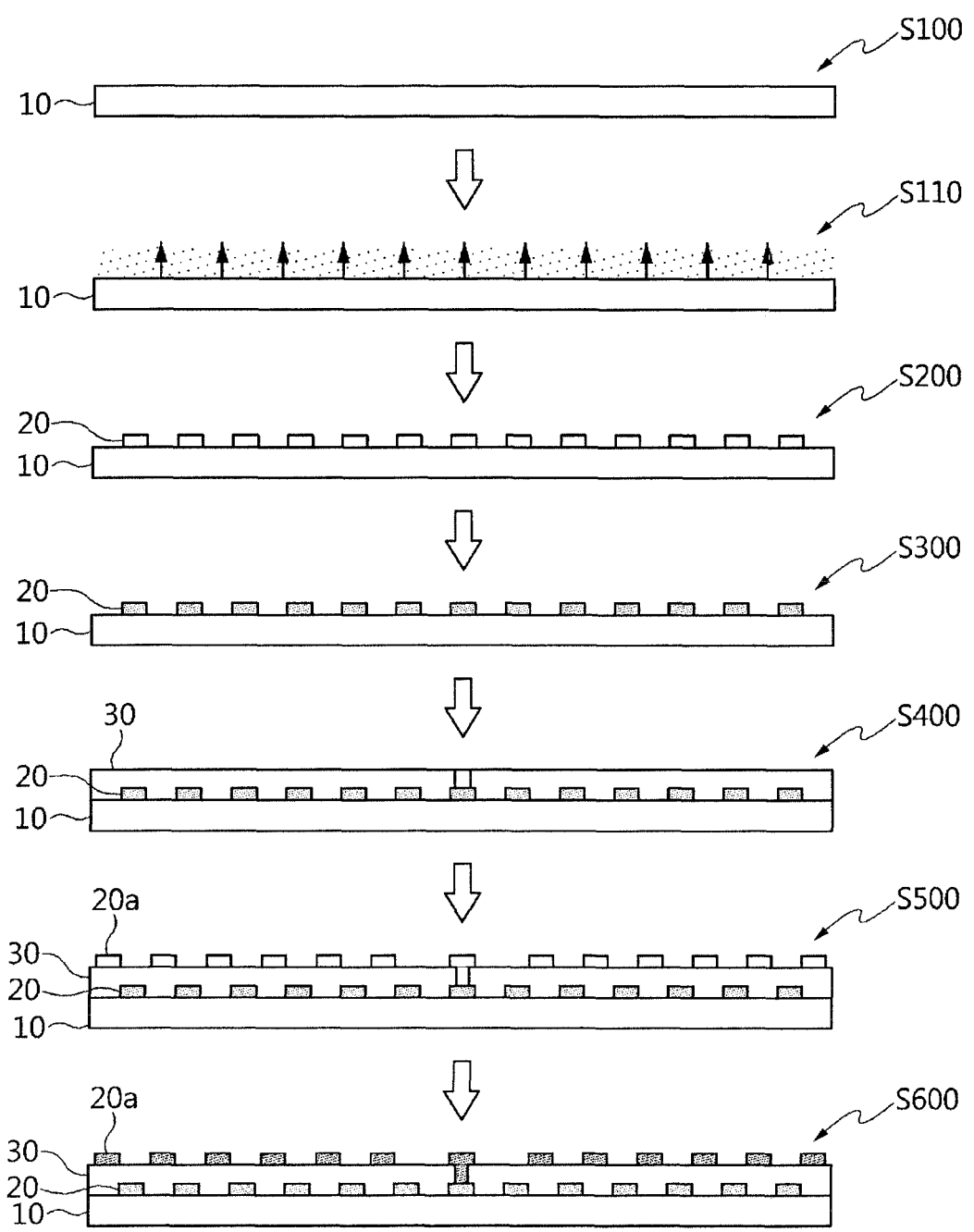
FIG. 2 schematically illustrates the process of manufacturing a flexible printed circuit board according to an embodiment of the disclosure.

FIGS. 1 and 2 illustrate the process of manufacturing a flexible printed circuit board according to an embodiment of the disclosure. With reference to FIGS. 1 and 2, the method for manufacturing the flexible printed circuit board according to an embodiment of the disclosure comprises preliminarily thermally deforming a substrate 10 through heating (S100), forming a circuit pattern 20 with a conductive paste on the preliminarily thermally deformed substrate 10 (S200), and firing the circuit pattern 20 (S300).

The substrate 10 may be exemplified by a PI film, a PET film, or a polyester film. Particularly useful is a PI film. A PI film is inexpensive, and has sufficiently high heat resistance to withstand a firing process at a temperature ranging from 200 to 450° C. Furthermore, a PI film is thin and highly flexible.

The preliminarily thermally deforming step (S100) is a preliminary thermal treatment process for preventing the substrate 10 from deforming when fired, thereby increasing the dimensional stability of the substrate 10.

On the first surface of the substrate 10, preliminarily thermally treated in S100, the circuit pattern 20 is formed with the conductive paste. The step of forming the circuit pattern 20 (S200) is preferably performed in a manner in which the circuit pattern 20 is formed into a predetermined circuit on the first surface of the substrate 10 through screen printing.

The step of forming the circuit pattern 20 (S200) includes drying the printed conductive paste, and the conductive paste may be dried at a temperature of 80° C. or less.

The conductive paste comprises a conductive metal powder and a binder. The conductive metal powder may include any one or a mixture of two or more selected from among silver, copper, aluminum, and nickel.

The conductive paste is preferably a silver paste comprising a silver powder, a polymer resin, and a solvent. The silver paste comprises 73 to 88 wt % of a silver powder, 5.9 to 9.5 wt % of a polymer resin, and 5.7 to 18.0 wt % of a solvent.

The silver paste may further comprise 0.35 to 2.90 wt % of a dispersant.

The polymer resin may be exemplified by polyester, with a molecular weight of 25,000.

The silver powder has a particle size ranging from 50 nm to 5 μm, and preferably from 0.5 to 1.2 μm. When the silver powder has a small particle size, it may easily move upon printing, and silver powder particles may be attached to each other upon firing to thus decrease resistance. The use of silver powder having a particle size larger than 5 μm makes it difficult to realize a resistance of 30Ω or less, and preferably 23Ω or less.

The conductive paste may include the conductive powder, especially any one or a mixture of two or more selected from among silver, copper, aluminum, and nickel.

The screen printing exhibits a high curing rate and superior adhesion and flexibility, and is thus suitable for forming a fine pattern, so that a predesigned coordinate input circuit pattern may be formed at low cost.

The step of firing the circuit pattern 20 (S300) is performed by firing the circuit pattern 20 formed of the silver paste on the substrate 10 at 200 to 450° C., and preferably 290 to 420° C. A firing temperature of 290 to 420° C. enables the stable firing of the circuit pattern 20 without deforming or damaging the synthetic resin film, that is, the PI film, which is the substrate 10 for the flexible printed circuit board. Given the above temperature range, the circuit pattern 20, which is fired after being printed with the conductive paste, may have a resistivity in a predetermined range, and the adhesion of the circuit pattern 20 meets or exceeds a critical level.

The firing step is performed to increase electrical conductivity through the growth of silver powder particles, and to enhance adhesion between the substrate 10 and the conductive material loaded in a via hole, as will be described later.

The conductive powder (silver powder), printed on the substrate 10 and dried, may undergo interfacial separation from the substrate 10 or cracking.

When the printed conductive paste is merely dried without firing, electrical conduction occurs by the contact between silver powder particles, and when firing is performed, electrical conduction occurs by the growth of silver powder particles. Hence, when firing is carried out after drying, electrical conductivity is further increased by the growth of silver powder particles, thereby further decreasing the resistance and preventing interfacial separation and cracking.

If the firing temperature is lower than 200° C., there is no effect of preventing interfacial separation and cracking. In contrast, if the firing temperature is higher than 450° C., the substrate 10 may be carbonized. Preferably, firing is carried out in the temperature range of 300 to 450° C.

The circuit pattern 20 is formed to have a resistivity ranging from 4.0 to 6.5 μΩ·cm.

In the preliminarily thermally deforming step (S100), the substrate 10, namely the PI film, is heated to a temperature higher than or equal to the firing temperature in the step of firing the circuit pattern 20 (S300) so that the PI film is preliminarily deformed, thereby preventing the PI film from becoming deformed in the step of firing the circuit pattern 20 (S300).

In the step of firing the circuit pattern 20 (S300), the firing temperature is determined depending on the kind of flexible printed circuit board to be manufactured, the composition of the corresponding conductive paste, and the resistivity required of the circuit pattern 20. In the preliminarily thermally deforming step (S100), the substrate 10 is heated to a temperature higher than or equal to the firing temperature, which is set in the step of firing the circuit pattern 20 (S300), so that the substrate is preliminarily deformed.

Tables 1 to 3 below show the shrinkage variation of PI films, resulting from preliminary thermal treatment of PI films having different thickness and sizes at 400° C. for 7 hours and then heating of the preliminarily thermally treated PI films to a firing temperature of 350° C.

Table 1 below illustrates PI films having a thickness of ½ mil.

TABLE 1

| Film thickness | Film size (mm) | Shrinkage variation of film after preliminary thermal treatment (400° C., 7 hours) | Shrinkage at firing temp. (350° C., 30 minutes) | Cumulative shrinkage variation |
|---|---|---|---|---|
| ½ mil | 287 | −1.8 (0.63%) | 0 | −1.8 (0.63%) |
| | 309 | −1.5 (0.49%) | 0 | −1.5 (0.49%) |
| | 250 | −0.5 (0.2%) | 0 | −0.5 (0.2%) |
| | 229 | −1.0 (0.44%) | 0 | −1.0 (0.44%) |

Table 2 below illustrates PI films having a thickness of 1 mil.

TABLE 2

| Film thickness | Film size (mm) | Shrinkage variation of film after preliminary thermal treatment (400° C., 7 hours) | Shrinkage at firing temp. (350° C., 30 minutes) | Cumulative shrinkage variation |
|---|---|---|---|---|
| 1 mil | 291 | −2.0 (0.69%) | 0 | −2.0 (0.69%) |
| | 310 | −2.5 (0.81%) | 0 | −2.5 (0.81%) |
| | 250 | −1.5 (0.60%) | 0 | −1.5 (0.60%) |
| | 233 | −1.3 (0.56%) | 0 | −1.3 (0.56%) |

Table 3 below illustrates PI films having a thickness of 2 mil.

TABLE 3

| Film thickness | Film size (mm) | Shrinkage variation of film after preliminary thermal treatment (400° C., 7 hours) | Shrinkage at firing temp. (350° C., 30 minutes) | Cumulative shrinkage variation |
|---|---|---|---|---|
| 2 mil | 286 | −2.5 (0.87%) | 0 | −2.5 (0.87%) |
| | 306 | −3.7 (1.21%) | 0 | −3.7 (1.21%) |
| | 250 | −2.0 (0.80%) | 0 | −2.0 (0.80%) |
| | 227 | −2.0 (0.88%) | 0 | −2.0 (0.88%) |

As is apparent from Tables 1 to 3, when preliminary thermal treatment is performed at a temperature higher than the firing temperature, there are no changes in shrinkage of the PI films upon re-heating at the firing temperature after preliminary thermal treatment, regardless of the thickness and size of the film.

Specifically, in the step of preliminarily thermally deforming the substrate 10 through heating (S100), the PI film is preliminarily deformed before firing, thereby preventing the PI film from shrinking when the circuit pattern 20 is fired, thus ensuring the dimensional stability of the substrate 10 so that the circuit pattern 20 is precisely formed at a predesigned position thereof. Furthermore, adhesion of the circuit pattern 20 to the substrate 10 is prevented from deterioration attributable to the deformation of the substrate 10 caused by firing.

In the step of preliminarily thermally deforming the substrate 10 through heating (S100), the PI film, stored in the form of a roll, is heated in a heating furnace having a box shape, whereby a large PI film may be preliminarily thermally treated at one time, after which the preliminarily thermally treated PI film in roll form may be sequentially subjected to the steps of forming the circuit pattern 20 (S200) and firing the circuit pattern 20 (S300), using a roll-to-roll process.

The method for manufacturing the flexible printed circuit board according to this disclosure preferably further comprises baking the preliminarily thermally deformed substrate 10 through heating to remove water from the substrate 10 (S110).

Because the preliminarily thermally deformed substrate 10 may absorb water when stored for a long time, the baking step (S110) is performed by heating the substrate 10 at a temperature of 80 to 150° C., whereby water is removed from the substrate 10.

Before the step of forming the circuit pattern 20 (S200), the baking step (S110) is performed in a manner in which the substrate 10 that is being stored is heated to remove water therefrom, thus preventing the substrate 10 from shrinking due to the presence of water therein in the step of firing the circuit pattern 20 (S300). In particular, since the PI film that is being stored may absorb water, the baking step (S110) may be performed before the step of forming the circuit pattern 20 (S200).

The method for manufacturing the flexible printed circuit board according to the disclosure preferably further comprises forming a protective coating layer 30 for protecting the circuit pattern 20 by applying a coating solution on the first surface of the substrate 10 (S400), after firing the circuit pattern 20 (S300).

In the step of forming the protective coating layer 30 (S400), the coating solution is applied on the first surface of the substrate 10 to form a protective coating layer 30, followed by drying, resulting in the protective coating layer 30.

The coating solution is a PI solution comprising 15 to 35 wt % of PI, resulting from dissolving PI in a solvent, in which the solvent may be an NMP diluted solution.

The coating solution may be a PAI solution, and the PAI solution may be applied to thereby form the protective coating layer 30.

In the step of forming the protective coating layer 30 (S400), the coating solution applied on the first surface of the substrate 10 is dried by being heated at 90 to 150° C. for 5 to 25 minutes.

The protective coating layer 30 is preferably formed to a thickness of at least 9 μm, and preferably 10 μm or more, on the circuit pattern 20. This thickness corresponds to the minimum thickness that allows the protective coating layer to function as an insulating layer for insulating the circuit pattern 20.

In the step of forming the protective coating layer 30 (S400), the coating solution is applied on the first surface of the substrate 10 through screen printing, and the thickness of the coating solution may be adjusted by varying the mesh size of the screen upon screen printing.

The protective coating layer 30 has to be formed to a thickness of at least 9 μm on the circuit pattern 20. When the thickness of the circuit pattern 20 is 10 μm, the protective coating layer 30 is formed to have a thickness of at least 19 μm on the first surface of the substrate 10. When the thickness of the circuit pattern 20 is 15 μm, the protective coating layer 30 is preferably formed to a thickness of at least 24 μm on the substrate.

The protective coating layer 30 is preferably formed through a single screen printing process in order to simplify the manufacturing process and to reduce the manufacturing cost, and the screen has a mesh size of 40 to 70 mesh per square inch, which means that the number of openings per square inch is 40 to 70.

Specifically, the protective coating layer 30 is responsible for protecting the circuit pattern 20 formed on the first surface of the substrate 10, more firmly attaching the circuit pattern 20 to the substrate 10, and preventing the circuit pattern 20 from being separated from the substrate 10, even upon warping of the substrate 10.

The protective coating layer 30 may be provided such that an insulating layer for covering the circuit pattern 20 is formed on the first surface of the substrate 10, thus facilitating the formation of a double-layer circuit.

The method for manufacturing the flexible printed circuit board according to this disclosure further comprises forming an additional circuit pattern 20a with a conductive paste on the first surface of the protective coating layer 30 (S500) and firing the additional circuit pattern 20a (S600).

The step of forming the additional circuit pattern 20a (S500) is the same as the step of forming the circuit pattern 20 (S200), and thus a redundant description thereof is omitted.

The step of firing the additional circuit pattern 20a (S600) is the same as the step of firing the circuit pattern 20 (S300), and thus a redundant description thereof is omitted.

The step of firing the additional circuit pattern 20a (S600) plays a role in curing the protective coating layer 30 as well as in firing the additional circuit pattern 20a.

The additional circuit pattern 20a is electrically connected to the circuit pattern 20. The step of forming the protective coating layer 30 (S400) serves to form the protective coating layer 30, excluding a portion in which the additional circuit pattern 20a and the circuit pattern 20 are electrically connected to each other. In the step of forming the additional circuit pattern 20a (S500), the additional circuit pattern 20a is formed using a conductive paste through screen printing, and the additional circuit pattern 20a is electrically connected to the protective coating layer 30. When the additional circuit pattern 20a is formed with the conductive paste, the conductive paste is loaded in the portion excluded from the protective coating layer 30 so as to realize electrical connection, whereby the additional circuit pattern 20a and the circuit pattern 20 are electrically connected to each other.

Alternatively, a via hole may be formed in the protective coating layer 30 through drilling, and may then be filled with the conductive paste, thereby electrically connecting the additional circuit pattern 20a and the circuit pattern 20 to each other.

Figure 3:
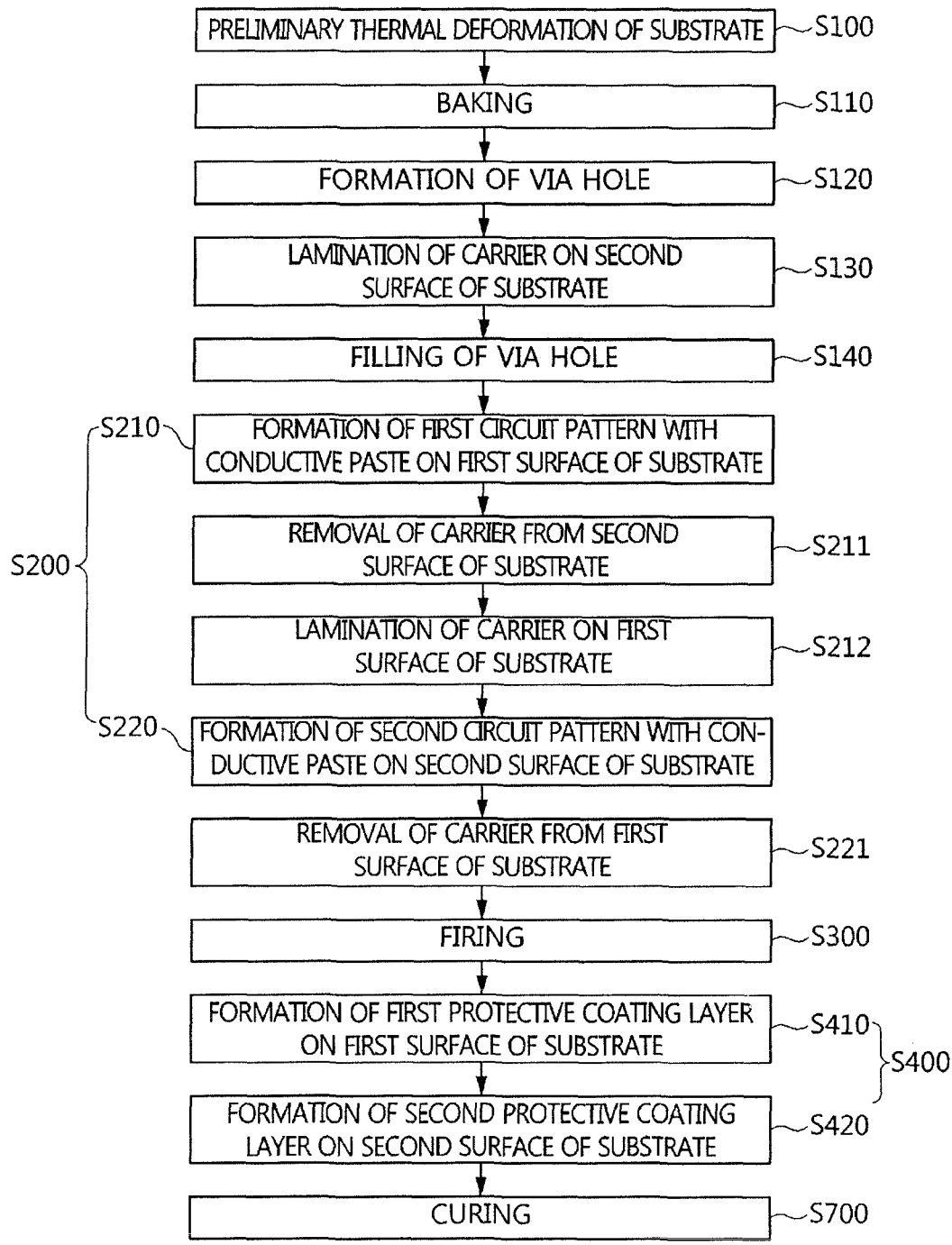
FIG. 3 is a flowchart illustrating the process of manufacturing a flexible printed circuit board according to another embodiment of this disclosure.
Figure 4:
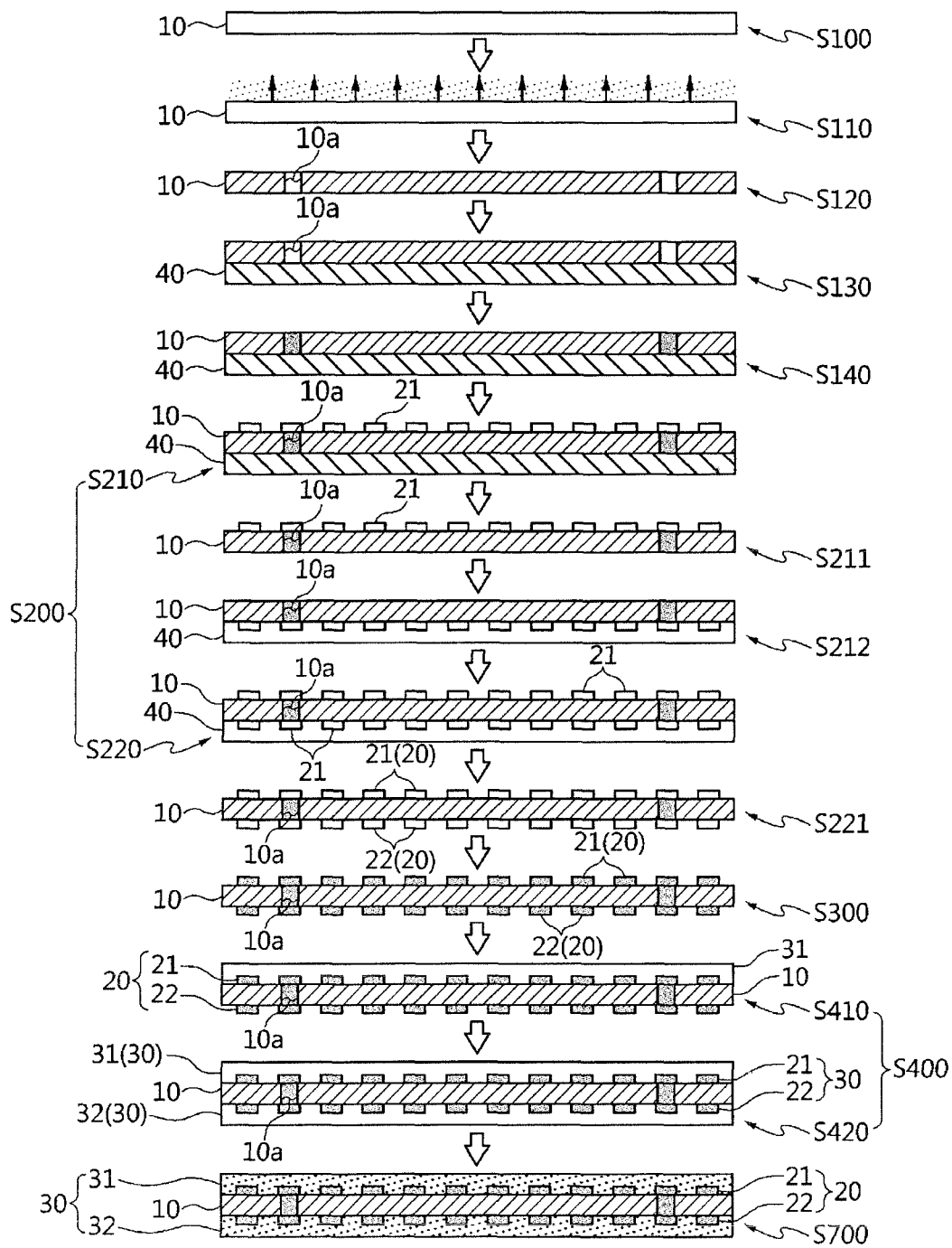
FIG. 4 schematically illustrates the process of manufacturing a flexible printed circuit board according to another embodiment of the disclosure.

With reference to FIGS. 3 and 4, the method for manufacturing the flexible printed circuit board according to the disclosure further comprises forming a via hole in the substrate 10, which was preliminarily thermally deformed in S100 (S120), and filling the via hole with the conductive paste (S140).

The baking step (S110) may be performed before the step of forming the via hole (S120), and the baking step (S110) is the same as in the above embodiment, and thus a redundant description thereof is omitted.

The via hole is formed using a drill or laser at a position necessary for the substrate 10, that is, a position suitable for a predesigned circuit. The via hole is provided to electrically connect the first circuit pattern 21, formed on the first surface of the substrate 10, to the second circuit pattern 22, formed on the second surface of the substrate 10, and the via hole is filled with the conductive paste in S140 so that the first circuit pattern 21 may be electrically connected to the second circuit pattern 22 formed on the second surface of the substrate 10.

The method for manufacturing the flexible printed circuit board according to this disclosure preferably further comprises laminating a carrier 40 on the second surface of the substrate 10 (S130), between the steps of forming the via hole (S120) and filling the via hole (S140).

Specifically, the via hole is formed in the substrate 10, the carrier 40 is laminated on the second surface of the substrate 10, and the via hole is printed with the conductive paste on the first surface of the substrate 10, thereby filling the via hole with the conductive paste.

The carrier 40 functions to sufficiently fill the via hole with the conductive paste. Also, the carrier 40 may prevent the conductive paste from flowing to the second surface of the substrate 10 through the via hole and may absorb the conductive paste, whereby the conductive paste may be loaded only in the via hole. Accordingly, contamination of the substrate 10 and thus short circuits, attributable to the flow of the conductive paste to the second surface of the substrate 10, may be prevented.

The carrier 40 includes an absorbent paper, preferably a writing paper. Writing paper has low density, so that the conductive paste is absorbed well between the pores therein. The carrier 40 has an adhesive attached thereto, and is thus easily laminated on the substrate 10.

The carrier 40 may be laminated on or removed from the first or second surface of the substrate 10 using a roll-to-roll process. The roll-to-roll process is continuously performed in a manner in which, while the substrate 10, in the form of a roll, is unwound, the carrier 40 is laminated on the surface of the substrate 10, and the conductive paste is printed on the surface of the substrate opposite the surface on which the carrier 40 is laminated, thereby forming a pattern. The roll-to-roll process enables mass production and reduces the production cost.

The step of forming the circuit pattern 20 (S200) includes forming a first circuit pattern 21 with the conductive paste on the first surface of the substrate 10 (S210) and forming a second circuit pattern 22 with the conductive paste on the second surface of the substrate 10 (S220).

The first circuit pattern 21 and the second circuit pattern 22 are electrically connected to each other through the conductive paste loaded in the via hole.

Each of the steps of forming the first circuit pattern 21 (S210) and foiling the second circuit pattern 22 (S220) includes drying the conductive paste. Here, the conductive paste may be dried at a temperature of 80° C. or less.

The step of filling the via hole (S140) is performed so that the conductive paste is completely loaded in the via hole by preliminarily filling the via hole with the conductive paste on the first surface of the substrate 10 before forming the first circuit pattern 21 (S210).

In the step of filling the via hole (S140), the via hole may be sufficiently filled with the conductive paste on the first surface of the substrate 10, but may be insufficiently filled with the conductive paste on the second surface of the substrate 10.

The portion of the via hole that is not filled with the conductive paste on the second surface of the substrate 10 is filled in the course of forming the second circuit pattern 22 (S220), whereby the conductive paste is loaded into the via hole to thus stably electrically connect the first circuit pattern 21 and the second circuit pattern 22 to each other, thus increasing operational reliability.

Also, the method for manufacturing the flexible printed circuit board according to this disclosure further comprises removing the carrier 40 from the second surface of the substrate 10 (S211) after forming the first circuit pattern on the first surface of the substrate 10, laminating the carrier 40 on the first surface of the substrate 10 (S212) before forming the second circuit pattern, and removing the carrier 40 from the first surface of the substrate 10 (S221) after forming the second circuit pattern 22.

The carrier 40 functions to block the via hole in the first surface of the substrate 10 so that the via hole is filled with sufficient conductive paste. Also, the conductive paste loaded in the via hole may be prevented from flowing toward the first surface of the substrate 10 in the course of forming the second circuit pattern 22 (S220).

The carrier 40 enables the conductive paste to be sufficiently loaded in the via hole. Also, the carrier 40 may block the conductive paste from flowing to the first surface of the substrate 10 through the via hole and may absorb the conductive paste, whereby the conductive paste is loaded only in the via hole. Ultimately, contamination of the substrate 10 and thus short circuits, attributable to the flow of the conductive paste toward the first surface of the substrate 10, are prevented.

For example, the first circuit pattern 21 is an X-axis coordinate recognition pattern part having a plurality of X-axis electrodes spaced apart from each other, and the second circuit pattern 22 is a Y-axis coordinate recognition pattern part having a plurality of Y-axis electrodes spaced apart from each other.

According to this disclosure, the flexible printed circuit board is exemplified by a digitizer configured such that the X-axis coordinate recognition pattern part is formed on the first surface thereof and the Y-axis coordinate recognition pattern part is formed on the second surface thereof to determine the coordinates of touch points. The X-axis coordinate recognition pattern part and the Y-axis coordinate recognition pattern part are electrically conducted to each other through the via hole.

The circuit pattern 20 may be provided in a grid form, composed of a plurality of sets of X-Y coordinates on the first and second surfaces of the substrate 10.

After forming the first circuit pattern 21 (S210) and forming the second circuit pattern 22 (S220), firing the circuit pattern 20 (S300) is performed, in which the first circuit pattern 21 and the second circuit pattern 22 are fired.

The step of forming the protective coating layer 30 (S400), which is performed after the step of firing the circuit pattern 20 (S300), includes forming a first protective coating layer 31 on the first surface of the substrate 10 by applying a coating solution on the first surface of the substrate 10 (S410) and forming a second protective coating layer 32 on the second surface of the substrate 10 by applying a coating solution on the second surface of the substrate 10 (S420).

The formation of the first protective coating layer 31 (S410) includes applying the coating solution on the first surface of the substrate 10 to form a first protective coating layer 31, which is then dried, yielding the desired first protective coating layer 31.

The formation of the second protective coating layer 32 (S420) includes applying the coating solution on the second surface of the substrate 10 to form a second protective coating layer 32, which is then dried, yielding the desired first protective coating layer 31.

The coating solution may be a PAI solution, and the PAI solution may be applied, thereby forming the protective coating layer.

The coating solution applied on each of the first and second surfaces of the substrate 10 is dried by being heated at 90 to 150° C. for 5 to 25 minutes, resulting in the first protective coating layer 31 and the second protective coating layer 32.

The method for manufacturing the flexible printed circuit board according to this disclosure further comprises curing the first protective coating layer 31 and the second protective coating layer 32 through heating (S700).

The curing step (S700) is performed by heating the first protective coating layer 31 and the second protective coating layer 32 at 200 to 450° C. for 20 to 50 minutes.

The first protective coating layer 31 and the second protective coating layer 32, cured in S700, may prevent the first circuit pattern 21 and the second circuit pattern 22 from being separated due to the warpage of the substrate 10, and may enhance the adhesion of the first circuit pattern 21 and the second circuit pattern 22.

Although not shown, filling the via hole in the second surface of the substrate 10 may be further performed, before forming the second circuit pattern 22.

Figure 5:
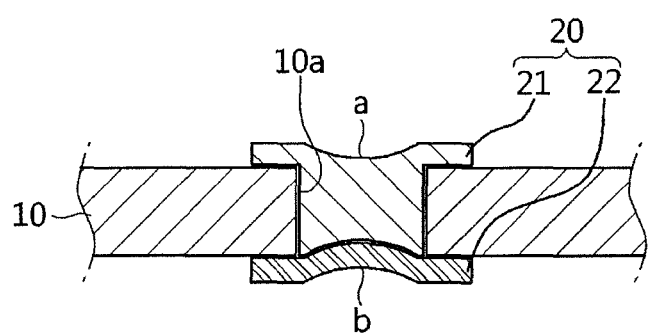
FIG. 5 is a cross-sectional view illustrating the via hole in the process of manufacturing the flexible printed circuit board according to the disclosure.

With reference to FIG. 5, the conductive paste loaded in the via hole may be dried at a temperature of 80° C. or less. When the conductive paste loaded in the via hole is dried, the top and bottom thereof may become recessed due to gravity.

The case where the via hole is filled once is problematic in that the via hole is incompletely filled, thus causing an operational reliability problem when the first circuit pattern 21 is connected to the second circuit pattern 22. When the conductive paste is dried, the shape thereof in the via hole may become concave due to gravity. Hence, the via hole has to be filled twice in order to ensure the reliability of the via hole.

Specifically, the via hole is primarily filled with the conductive paste before printing the first circuit pattern 21 on the first surface of the substrate 10, and the via hole is secondarily filled with the conductive paste before printing the second circuit pattern 22 on the second surface of the substrate 10.

Thereby, sufficient conductive paste is loaded in the via hole 10a, thus assuring reliability of the connection between the pattern on the first surface of the insulating film and the pattern on the second surface thereof through the via hole.

Figure 6:
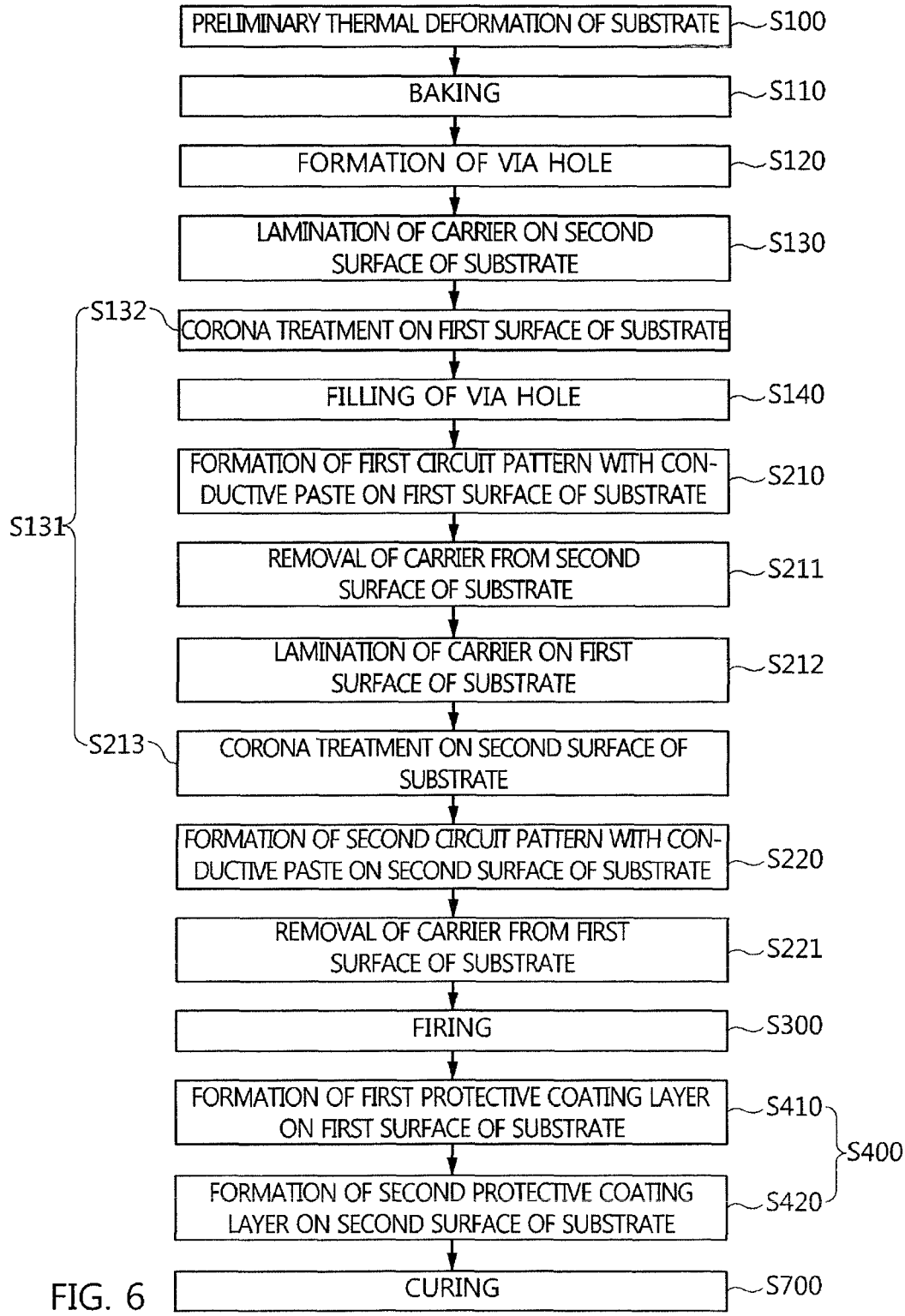
FIG. 6 is a flowchart illustrating the process of manufacturing a flexible printed circuit board according to still another embodiment of the disclosure.

With reference to FIG. 6, the step of firing the circuit pattern 20 (S300) may include firing the first circuit pattern 21 and firing the second circuit pattern 22.

The first circuit pattern 21 is printed with the conductive paste on the first surface of the substrate 10, followed by primary drying and primary sintering, after which the second circuit pattern 22 is printed with the conductive paste on the second surface of the substrate 10, followed by secondary drying and secondary sintering. Thereby, the via hole may be filled with sufficient conductive paste, and operational reliability between the first circuit pattern 21 and the second circuit pattern 22, which are electrically connected through the via hole, may result.

Firing the first circuit pattern 21 is performed to fix the shape of the conductive paste on the dried insulating film having no carrier 40. When the dried conductive paste is sintered, the shape of the conductive paste loaded in the via hole is maintained, and further shrinkage does not occur.

The via hole is filled with sufficient conductive paste, and interfacial separation from the substrate 10 and cracking may be prevented.

After firing the first circuit pattern 21, the top and bottom of the conductive paste loaded in the via hole are recessed further, and become more concave, than after primary drying. However, the sintered conductive paste does not shrink any further, thus easily ensuring sufficient loading of the conductive paste into the via hole.

The via hole is primarily filled with the conductive paste so that the conductive paste is loaded in the via hole when the first circuit pattern 21 is printed on the first surface of the substrate 10, and the via hole is secondarily filled with the conductive paste so that the conductive paste 19 is loaded in the via hole when the second circuit pattern 22 is printed on the second surface of the substrate 10.

Thereby, the via hole is filled with sufficient conductive paste, the first circuit pattern 21 and the second circuit pattern 22 of the substrate 10 are stably electrically connected to each other through the via hole, and the operational reliability of the first circuit pattern 21 and the second circuit pattern 22 is ensured.

Also, the method for manufacturing the flexible printed circuit board according to the disclosure further comprises performing corona treatment (S131) for modifying the surface of the substrate 10 before forming the circuit pattern 20.

The corona treatment step (S131) includes subjecting the first surface of the substrate 10 to corona treatment (S132) before forming the first circuit pattern 21 and subjecting the second surface of the substrate 10 to corona treatment (S213) before forming the second circuit pattern 22.

The corona treatment step (S131) is performed to modify the entire surface of the substrate 10 or a pattern-forming portion thereof.

Surface modification may be carried out using any one selected from among plasma treatment, corona treatment, laser processing, etching, and physical treatment. Particularly useful is corona treatment, which is characterized by a short treatment time and high workability.

Corona treatment functions to modify the surface of the substrate 10 without damage to the substrate 10 such as shrinkage or deformation, thus enhancing adhesion between the substrate 10 and the conductive paste.

Surface modification of the entire surface of the substrate 10 or a pattern-forming portion thereof may enhance adhesion between the conductive paste and the substrate 10, thereby solving the problem of stripping of the sintered conductive paste.

Subjecting the first surface of the substrate 10 to corona treatment (S132) is preferably performed after the carrier 40 is laminated on the substrate 10 and the via hole is filled (S140). The via hole is filled with the conductive paste, after which the conductive paste loaded in the via hole may be dried. When drying is performed after corona treatment, the effect of corona treatment is reduced. Hence, when filling the via hole with the conductive paste, performing the corona treatment, and printing the pattern with the conductive paste on the substrate 10 are continuously carried out, the corona treatment effect is most preferably improved.

Subjecting the second surface of the substrate 10 to corona treatment (S213) is performed as follows: the step of filling the via hole (S140) is not additionally carried out because the via hole is filled when the second circuit pattern 22 is printed, the carrier 40 is laminated on the second surface of the substrate 10, corona treatment is carried out, and then the second circuit pattern 22 is formed through printing with the conductive paste.

In this disclosure, corona treatment is particularly useful, or alternatively, plasma treatment may be carried out on the entire surface of the substrate 10 or a pattern-forming portion thereof, thus forming fine roughness, thereby enhancing the adhesion between the conductive paste and the substrate 10.

A better understanding of this disclosure may be obtained through the following examples regarding the method for manufacturing the flexible printed circuit board.

Example 1

A silver paste comprising a silver powder having a particle size ranging from 50 nm to 5 μm and a polymer resin binder was printed on the first surface of an insulating film and the via hole and on the second surface of the insulating film and the via hole. Thereafter, the insulating film printed with the conductive paste was dried at room temperature and then thermally treated in a temperature range lower than 200° C. and in a temperature range of 300 to 450° C.

After curing and sintering of the silver paste according to the disclosure, the extent of growth of the silver powder particles was observed. Consequently, when thermal treatment (curing) was performed at a temperature of less than 200° C., the silver powder particles were in contact with each other, and when thermal treatment (sintering) was performed at 300 to 450° C., bindability between the silver powder particles was increased by the growth of the silver powder particles.

Based on the results of testing of this example, internal cracking of the conductive paste loaded in the via hole was prevented by sintering.

Example 2

Thermal analysis was performed depending on the sintering temperature of the silver paste. The polymer resin binder was ethyl cellulose.

Figure 7:
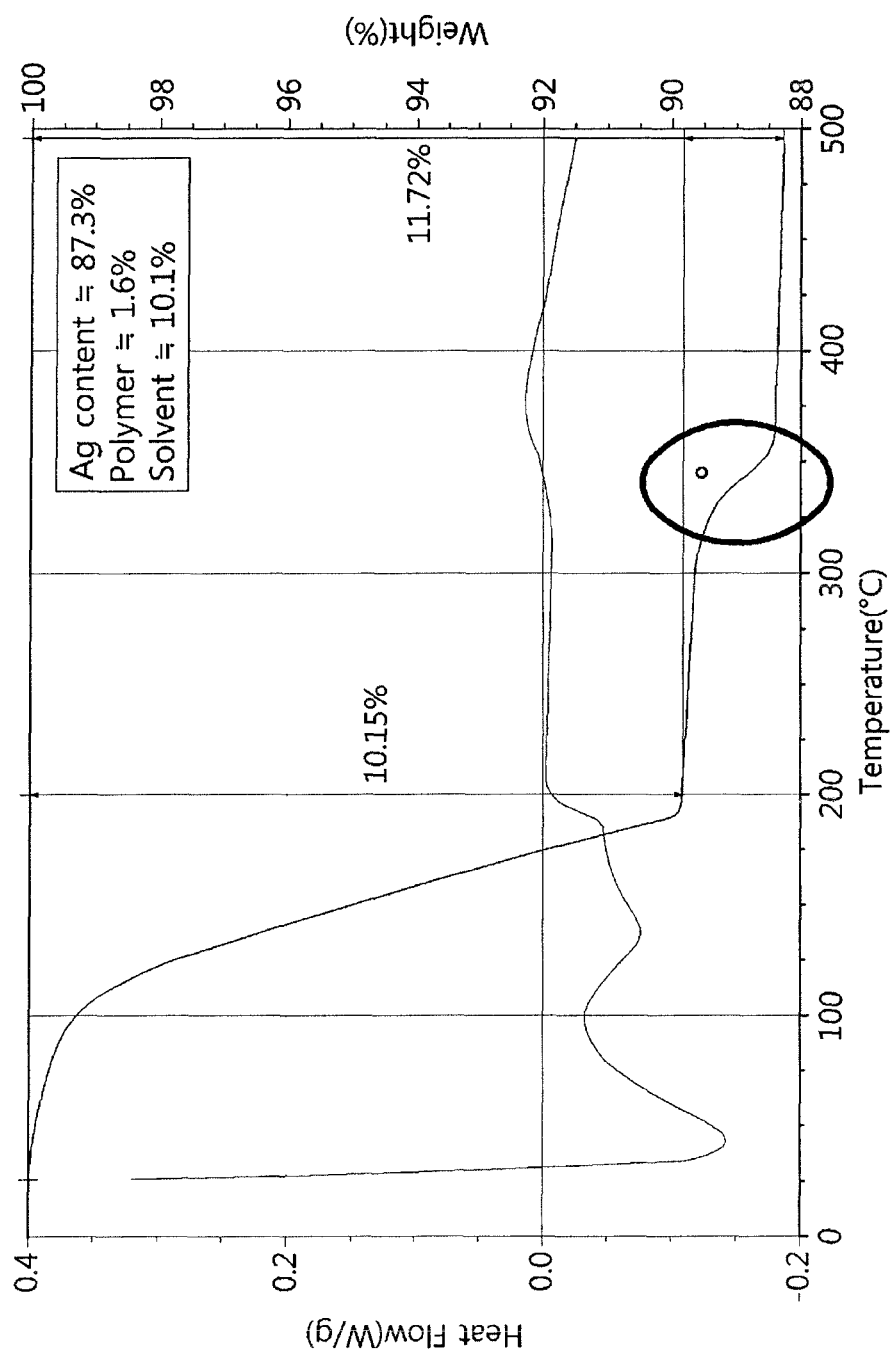
FIGS. 7 to 9 are graphs illustrating the results of thermal analysis of the silver paste according to this disclosure.
Figure 8:
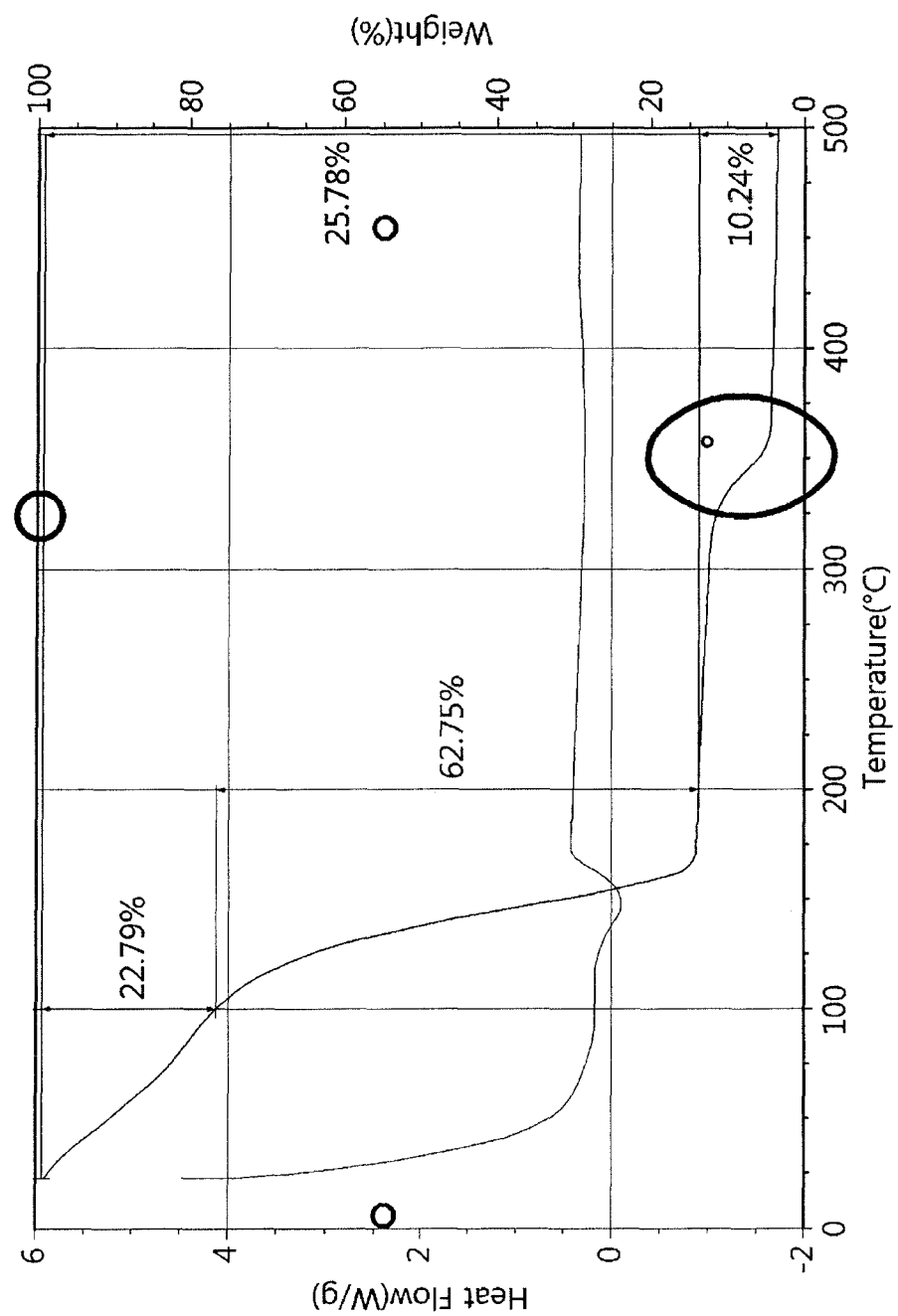
Figure 9:
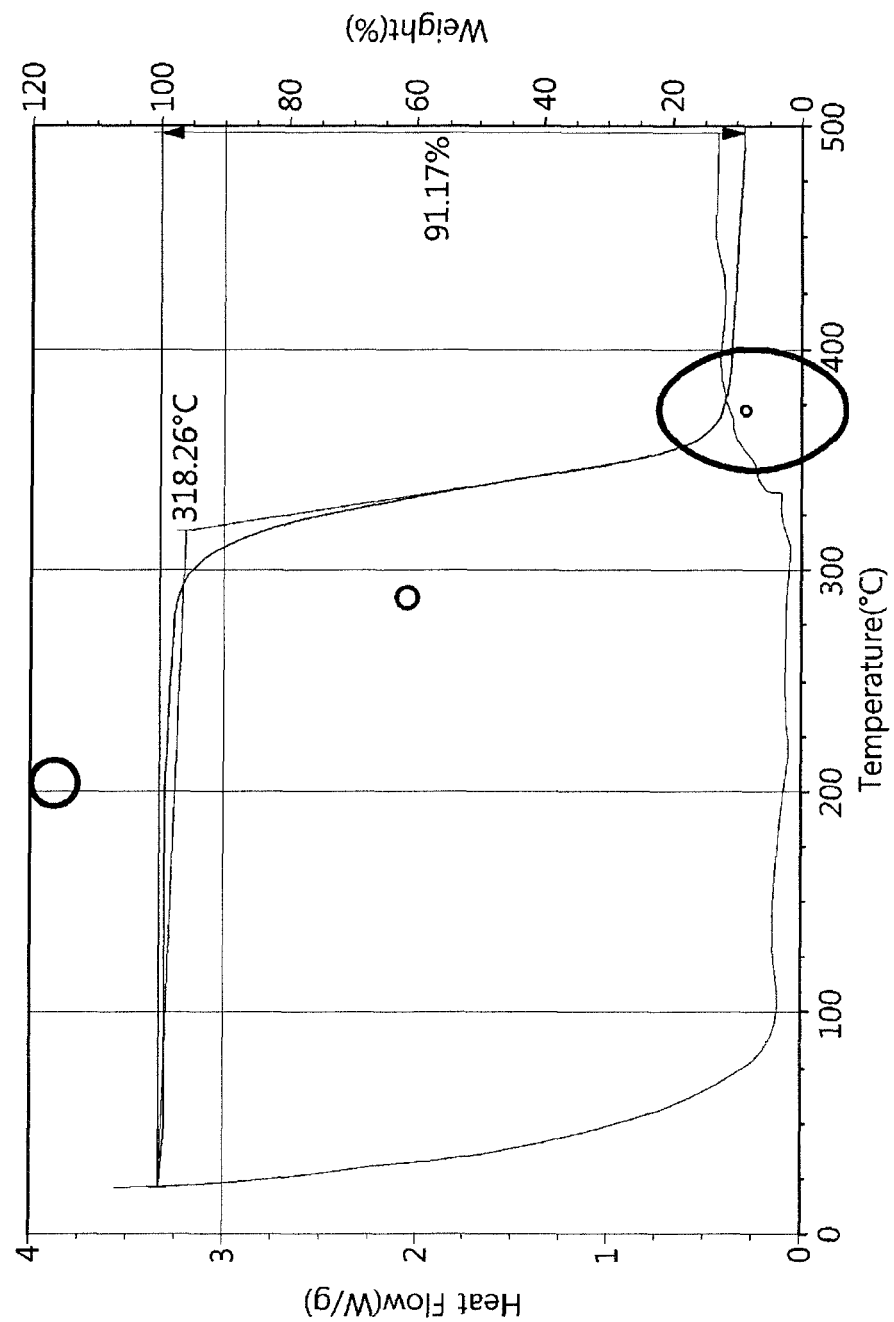

FIGS. 7 to 9 are graphs illustrating the results of thermal analysis of the silver paste according to this disclosure.

As illustrated in FIGS. 7 to 9, the thermal decomposition temperature of the polymer resin binder present in the silver paste was determined to be about 350° C., and the same results were also obtained when only the polymer resin binder was analyzed, after separation of the silver powder from the silver paste.

Therefore, when sintering was performed at 200 to 450° C., and preferably 300 to 450° C., desired adhesive strength between the insulating film and the silver paste was obtained. This is considered to be because firing was completed before thorough thermal decomposition of the polymer resin.

Based on the results of testing of FIGS. 7 to 9, interfacial separation between the insulating film and the conductive paste loaded in the via hole was prevented by sintering.

Example 3

The conductive paste for pattern printing was composed of a silver powder having a particle size ranging from 200 nm to 2 μm and a polymer resin binder, and sintering was performed in the temperature range of 200 to 450° C.

Based on the results of analysis of EDX for measuring the components after sintering of the silver paste according to the disclosure, the presence of pure silver (Ag) without inorganic additives was confirmed, and the silver powder particles were grown after sintering, in which the silver powder had a spherical shape.

Example 4

The conductive paste for printing the circuit pattern 20 was composed of a silver powder having a particle size ranging from 50 nm to 5 µm and a polymer resin binder, and sintering was performed in the temperature range of 200 to 450° C.

Based on the results of observation of SEM images for measuring the powder size of the silver paste according to this disclosure, the silver powder was determined to be a mixture comprising a powder having a size of about 1 µm and a powder having a size of about 500 nm. Furthermore, the use of the powder having a size of about 500 nm made it possible to realize desired resistance even upon sintering at 200 to 450° C.

The silver powder was composed of a mixture of particles having sizes of 200 to 300 nm, 400 to 500 nm, and 800 to 1500 nm.

Example 5

The resistance and resistivity of the flexible printed circuit board manufactured according to the disclosure were measured.

Table 4 below shows the results of measurement of the resistivity of the silver paste after sintering. The silver paste was composed of a silver powder having a particle size ranging from 200 to 500 nm and a polymer resin binder, and sintering was performed at 330° C.

TABLE 4

|  | Pattern (Line) | | | | |
| --- | --- | --- | --- | --- | --- |
|  | Width | Thickness | Length | Resistance | Resistivity |
| Nano Ag paste | 204 µm | 18 µm | 1.2 m | 18.5 Ω | 5.69 × 10$^{-6}$ Ωcm |

[Resistivity is resistance per unit length per unit cross-sectional area, and is calculated by "R=µL/A," wherein p is the resistivity, A is the cross-sectional area, L is the length, and R is the resistance.]

Table 5 below shows the results of measurement of resistivity of the silver paste after drying at room temperature.

TABLE 5

|  | Resistivity |
| --- | --- |
| Micro Ag paste | 5.4 × 10$^{-5}$ Ωcm |
| Nano Ag paste | 4.5 × 10$^{-5}$ Ωcm |
| Hybrid (Micro + Nano) Ag paste | 2.5 × 10$^{-5}$ Ωcm |

As is apparent from Tables 4 and 5, the nano silver paste in a solid phase had a resistance value close to the resistivity value.

Low resistance means that a coordinate recognition device having high electrical conductivity can be manufactured using the silver paste alone.

Through Examples 1 to 5, the conductive paste is printed on the insulating film and then sintered at 200 to 450° C., thereby preventing the cracking of the conductive paste loaded in the via hole, ensuring electrical conductivity, and assuring adhesive strength between the insulating film and the silver powder contained in the conductive paste.

Even when additional plating is not performed after printing with the conductive paste, operational reliability of chips on the flexible printed circuit board may be ensured and, thus, the manufacturing cost may be reduced.

Figure 10:
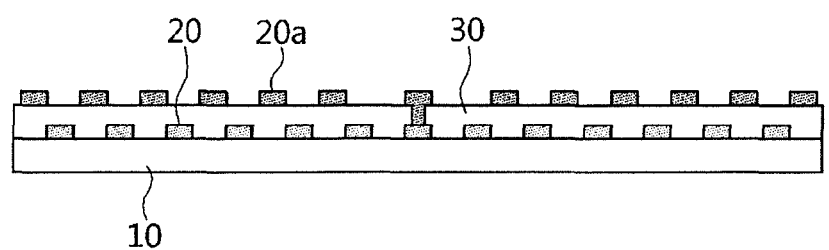
FIG. 10 is a cross-sectional view illustrating a flexible printed circuit board according to an embodiment of the disclosure.

Meanwhile, referring to FIG. 10, the flexible printed circuit board according to this disclosure comprises a substrate 10 and a circuit pattern 20 formed by firing a conductive paste on the substrate 10, and may further comprise a protective coating layer 30 for protecting the circuit pattern 20 formed on the substrate 10.

The substrate 10 may include any film in which the shrinkage variation before and after firing the conductive paste is zero through preliminary thermal deformation. Exemplarily useful is a PI film or a PET film, which is preliminarily thermally treated at a temperature higher than the firing temperature of the conductive paste.

The circuit pattern 20 is formed by applying and firing the conductive paste, namely a silver paste, and the protective coating layer 30 is faulted by applying, drying and curing a coating solution.

The substrate 10 and the conductive paste remain the same as in the above embodiments, and a redundant description thereof is omitted.

The protective coating layer 30 is preferably formed of a PI solution or a PAI solution. This is because the substrate 10 is a PI film and, thus, adhesion may be maximized through integration with the PI film or PET film.

The flexible printed circuit board according to this disclosure preferably further comprises an additional circuit pattern 20a formed on the protective coating layer 30. The additional circuit pattern 20a is electrically connected to the circuit pattern 20, and thus constitutes a double-layer circuit structure.

Specifically, additional circuit pattern layers 20a are sequentially formed on the protective coating layer 30, and the protective coating layer 30 is disposed between the additional circuit pattern layers 20a, and the additional circuit pattern layers 20a are interconnected through the via formed in the protective coating layer 30.

Figure 11:
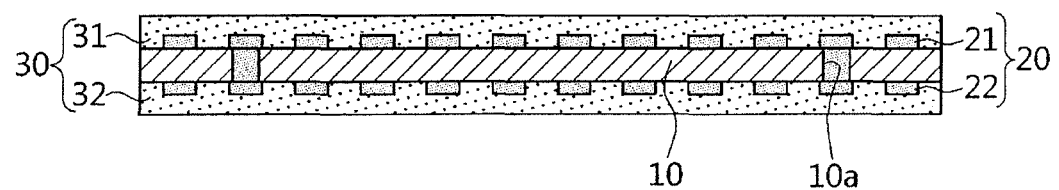
FIG. 11 is a cross-sectional view illustrating a flexible printed circuit board according to another embodiment of this disclosure.

With reference to FIG. 11, the circuit pattern 20 includes a first circuit pattern 21 formed on the first surface of the substrate 10 and a second circuit pattern 22 formed on the second surface of the substrate 10.

The protective coating layer 30 includes a first protective coating layer 31 formed on the first surface of the substrate 10 and a second protective coating layer 32 formed on the second surface of the substrate 10.

The first circuit pattern 21 is an X-axis coordinate recognition pattern part having a plurality of X-axis electrodes spaced apart from each other, and the second circuit pattern 22 is a Y-axis coordinate recognition pattern part having a plurality of Y-axis electrodes spaced apart from each other.

In the substrate 10, a via hole is formed to electrically connect the first circuit pattern 21 and the second circuit pattern 22 to each other, and the via hole is filled with the conductive paste and is then fired, whereby the first circuit pattern 21 is electrically connected to the second circuit pattern 22.

According to this disclosure, preliminary thermal treatment of the substrate 10 may ensure dimensional stability when the circuit pattern 20 printed with the conductive paste is fired, and may also prevent adhesion between the circuit pattern 20 and the substrate 10 from deteriorating due to the deformation of the film upon firing. Furthermore, stable adhesion of the circuit pattern 20 may be maintained even after firing.

According to the disclosure, the via hole is filled with sufficient conductive paste, the operational reliability of the circuit pattern 20 formed on both surfaces of the substrate 10 may be improved.

According to this disclosure, the circuit pattern 20 is protected by the coating layer, thus preventing the circuit pattern from damage due to warping or bending during the use thereof and maintaining the circuit pattern firmly attached to the substrate 10.

Although the preferred embodiments of the disclosure have been disclosed for illustrative purposes, those skilled in the art will appreciate that various modifications, additions and substitutions are possible without departing from the scope and spirit of the disclosure as disclosed in the accompanying claims.

What is claimed is:

1. A method for manufacturing a flexible printed circuit board, comprising:
    preliminarily thermally deforming a substrate through heating;
    forming a via hole in the substrate;
    filling the via hole with a conductive paste;
    laminating a carrier on a second surface of the substrate between forming the via hole and filling the via hole;
    forming a first circuit pattern with a conductive paste on a first surface of the preliminarily thermally deformed substrate;
    firing the first circuit pattern;
    forming a protective coating layer for protecting the first circuit pattern by applying a coating solution on a the first surface of the substrate after firing the first circuit pattern;
    removing the carrier from the second surface of the substrate after forming the first circuit pattern on the first surface of the substrate;
    laminating the carrier on the first surface of the substrate before forming a second circuit pattern;
    forming the second circuit pattern with a conductive paste on the second surface of the substrate;
    then removing the carrier from the first surface of the substrate after forming the second circuit pattern;
    forming an additional circuit pattern with a conductive paste on the protective coating layer; and firing the additional circuit pattern.

2. The method of claim 1, wherein the substrate is a polyimide (PI) film or a PET film.

3. The method of claim 1, wherein the conductive paste is a silver paste comprising a silver powder, a polymer resin, and a solvent.

4. The method of claim 1, wherein firing the first circuit pattern is performed at 200 to 450 C.

5. The method of claim 1, wherein preliminarily thermally deforming is performed by heating the substrate to a temperature higher than or equal to a temperature at which the first circuit pattern is fired.

6. The method of claim 1, further comprising baking the preliminarily thermally deformed substrate through heating to remove water therefrom after preliminarily thermally deforming the substrate through heating and before forming the first circuit pattern.

7. The method of claim 1, wherein forming the protective coating layer is performed by applying the coating solution on the first surface of the substrate to form a protective coating layer and drying the protective coating layer.

8. The method of claim 1, wherein the protective coating layer is formed to a thickness of at least 9 μm on the first circuit pattern.

9. The method of claim 1, wherein forming the protective coating layer is performed by applying the coating solution on the first surface of the substrate through screen printing, in which a thickness of the coating solution is adjusted by varying a mesh size of a screen.

10. The method of claim 1, further comprising modifying a surface of the substrate before forming the first circuit pattern.

11. The method of claim 1, wherein the first circuit pattern is an X-axis coordinate recognition pattern part including a plurality of X-axis electrodes spaced apart from each other, and the second circuit pattern is a Y-axis coordinate recognition pattern part including a plurality of Y-axis electrodes spaced apart from each other.

12. The method of claim 1, wherein the carrier is a writing paper.

13. The method of claim 1, wherein forming the protective coating layer comprises:
    applying the coating solution on the first surface of the substrate, thus forming a first protective coating layer on the first surface of the substrate; and
    applying the coating solution on the second surface of the substrate, thus forming a second protective coating layer on the second surface of the substrate.

14. The method of claim 13, further comprising curing the first protective coating layer and the second protective coating layer through heating.

15. The method of claim 14, wherein curing the first protective coating layer and the second protective coating layer is performed at 200 to 450 C.

16. The method of claim 1, further comprising performing corona treatment for modifying the first surface and the second surface of the substrate before forming the first circuit pattern and the second circuit pattern, wherein performing the corona treatment comprises:
    subjecting the first surface of the substrate to corona treatment before forming the first circuit pattern; and
    subjecting the second surface of the substrate to corona treatment before forming the second circuit pattern.

* * * * *

UNITED STATES PATENT AND TRADEMARK OFFICE
CERTIFICATE OF CORRECTION

PATENT NO. : 10,512,175 B2
APPLICATION NO. : 14/897200
DATED : December 17, 2019
INVENTOR(S) : O-Chung Kwon et al.

Page 1 of 1

It is certified that error appears in the above-identified patent and that said Letters Patent is hereby corrected as shown below:

In the Specification
    Column 10, Line 48, change "and foiling the" to --and forming the--
    Column 15, Line 37, change "wherein p is" to --wherein ρ is--
    Column 16, Line 16, change "is faulted by" to "is formed by--

In the Claims
Claim 1, Column 17, Line 27, change "solution on a the" to --solution on the--

Signed and Sealed this
Twenty-fifth Day of February, 2020

Andrei Iancu
*Director of the United States Patent and Trademark Office*